US009491549B2

(12) United States Patent
Mori et al.

(10) Patent No.: US 9,491,549 B2
(45) Date of Patent: Nov. 8, 2016

(54) EQUALIZER APPARATUS

(71) Applicant: Onkyo Corporation, Osaka (JP)

(72) Inventors: Kodai Mori, Osaka (JP); Nobuya Tachimori, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 83 days.

(21) Appl. No.: 14/513,335

(22) Filed: Oct. 14, 2014

(65) Prior Publication Data

US 2015/0104036 A1 Apr. 16, 2015

(30) Foreign Application Priority Data

Oct. 16, 2013 (JP) ................................ 2013-215501

(51) Int. Cl.
*H03G 5/00* (2006.01)
*H04R 5/04* (2006.01)
*H04R 5/033* (2006.01)
*H04R 3/04* (2006.01)

(52) U.S. Cl.
CPC ................ *H04R 5/04* (2013.01); *H04R 5/033* (2013.01); *H04R 3/04* (2013.01)

(58) Field of Classification Search
CPC ........... H04R 3/04; H04R 5/033; H04R 5/04
USPC ...................... 381/59, 61, 74, 103, 104, 309
See application file for complete search history.

(56) References Cited

U.S. PATENT DOCUMENTS

2008/0037805 A1* 2/2008 Kino ...................... H03G 5/165 381/101
2009/0103741 A1* 4/2009 Skuruls ................ H03G 1/0088 381/59
2011/0301731 A1 12/2011 Okimoto et al.
2012/0275616 A1* 11/2012 Yamamoto ........... H04R 29/001 381/74
2013/0236023 A1* 9/2013 Horbach .................. H04R 5/04 381/59
2014/0369519 A1* 12/2014 Leschka ................. H03G 5/165 381/74

FOREIGN PATENT DOCUMENTS

JP 2009-060209 3/2009
JP 2010-258967 11/2010
JP 2011-254297 12/2011
JP 2012-084949 4/2012

* cited by examiner

*Primary Examiner* — Vivian Chin
*Assistant Examiner* — Friedrich W Fahnert
(74) *Attorney, Agent, or Firm* — Renner, Otto, Boisselle & Sklar, LLP

(57) ABSTRACT

It is an object of the present invention to provide an audio having intended sound quality to a user even when a headphone that is different from a headphone used for generating equalizer information is used.

A correcting section corrects equalizer curve stored in an equalizer curve storage section based on a correction curve that is a gain difference of a frequency characteristic between a first headphone and a second headphone when the second headphone the frequency characteristic of which is different from that of the first headphone is used so as to output the corrected equalizer curve to a reproducing section. The reproducing section executes an equalizing process based on the equalizer curve output from the correcting section.

8 Claims, 13 Drawing Sheets

Fig. 2

| No | HEADPHONE INFORMATION | CORRECTION CURVE INFORMATION |
|---|---|---|
| 1 | HEADPHONE B | CORRECTION CURVE AB |
| 2 | HEADPHONE C | CORRECTION CURVE AC |
| 3 | HEADPHONE D | CORRECTION CURVE AD |
| 4 | HEADPHONE E | CORRECTION CURVE AE |
| 5 | HEADPHONE F | CORRECTION CURVE AF |

Fig. 7

| No | EQUALIZER CURVE INFORMATION | HEADPHONE INFORMATION |
|---|---|---|
| 1 | ROCK | HEADPHONE A |
| 2 | POPS | HEADPHONE B |
| 3 | JAZZ | HEADPHONE C |
| 4 | • • • | • • • |
| 5 | • • • | • • • |

Fig. 8

| No | HEADPHONE INFORMATION 1 | HEADPHONE INFORMATION 2 | CORRECTION CURVE INFORMATION |
|---|---|---|---|
| 1 | HEADPHONE A | HEADPHONE B | CORRECTION CURVE AB |
| 2 | HEADPHONE A | HEADPHONE C | CORRECTION CURVE AC |
| 3 | HEADPHONE B | HEADPHONE A | CORRECTION CURVE BA |
| 4 | HEADPHONE B | HEADPHONE C | CORRECTION CURVE BC |
| 5 | HEADPHONE C | HEADPHONE A | CORRECTION CURVE CA |
| 6 | HEADPHONE C | HEADPHONE B | CORRECTION CURVE CB |

EQUALIZER APPARATUS

BACKGROUND OF THE INVENTION

1. Field of the Invention

The present invention relates to an equalizer apparatus for executing an equalizing process for changing a frequency characteristic of an audio signal.

2. Description of the Related Art

The equalizer apparatus executes an equalizing process based on an equalizer curve (equalizer information) representing a gain with respect to a frequency. The equalizer apparatus stores equalizer curves according to genres such as rock, pops, and jazz, and a user can select an equalizer curve according to a genre.

The equalizer curve is generally generated based on a flat frequency characteristic in which a gain is not changed (0 dB) according to a frequency when different types of devices, such as headphones are likely to be connected to the apparatus. JP 2012-084949 A discloses the invention that stores correction curves (correction information) according to a plurality of headphones and corrects an equalizer curve, which is generated based on flat frequency characteristic, based on a correction curve related to a headphone to be connected to an apparatus from among a plurality of correction curves. Since this invention is for correcting the equalizer curve generated based on the flat frequency characteristic, the correction curve is the frequency characteristic of the headphone itself.

Further, the equalizer curve is occasionally generated based on, for example, the frequency characteristic of a certain headphone. In such a case, when a headphone different from the headphone used for generating the equalizer curve is used, a sound that is heard by a user does not have intended sound quality due to different frequency characteristics between the two headphones.

The invention described in JP 2012-084949 A is the invention that corrects an equalizer curve, which is generated based on a flat frequency characteristic, based on the correction curve as a frequency characteristic of a headphone. For this reason, when the equalizer curve is generated based on the frequency characteristic of a certain headphone and a headphone that is different from the headphone used for generating the equalizer curve is used, the above-described problem such that an audio heard by a user does not have intended sound quality cannot be solved.

SUMMARY OF THE INVENTION

It is an object of the present invention to provide an audio having intended sound quality to a user even when a headphone that is different from a headphone used for generating equalizer information is used.

An equalizer apparatus comprising: a first storage section for storing equalizer information based on a frequency characteristic of a first headphone; an equalizer section for executing an equalizing process for changing a frequency characteristic of an audio signal; and a correcting section for outputting the equalizer information stored in the first storage section to the equalizer section when the first headphone is used, and correcting the equalizer information stored in the first storage section based on correction information that is a gain difference of the frequency characteristic between the first headphone and a second headphone so as to output the corrected equalizer information to the equalizer section when a second headphone the frequency characteristic of which is different from that of the first headphone is used, wherein the equalizer section executes the equalizing process based on the equalizer information output from the correcting section.

In the present invention, in a case of a second headphone the frequency characteristic of which is different from that of a first headphone, equalizer information, which is generated based on the frequency characteristic of the first headphone, is corrected based on correction information that is a gain difference of the frequency characteristic between the first headphone and the second headphone. An equalizing process is executed based on the corrected equalizer information. For this reason, even when the second headphone that is different from the first headphone used for generating the equalizer information is used, the present invention can provide an audio having intended sound quality to the user.

An equalizer apparatus comprising: a first storage section for storing first equalizer information based on a frequency characteristic of a first headphone, and second equalizer information based on a frequency characteristic of a second headphone different from the frequency characteristic of the first headphone; an equalizer section for executing an equalizing process for changing a frequency characteristic of an audio signal; an accepting section for accepting selection of any one of the first equalizer information and the second equalizer information; and a correcting section for, when the accepting section accepts the selection of the first equalizer information and the first headphone is used, outputting the first equalizer information stored in the first storage section to the equalizer section, when the accepting section accepts the selection of the first equalizer information and the second headphone is used, correcting the first equalizer information stored in the first storage section based on correction information that is a gain difference of the frequency characteristic between the first headphone and the second headphone so as to output the corrected first equalizer information to the equalizer section, when the accepting section accepts the selection of the second equalizer information and the first headphone is used, correcting the second equalizer information stored in the first storage section based on the correction information so as to output the corrected second equalizer information to the equalizer section, when the accepting section accepts the selection of the second equalizer information and the second headphone is used, outputting the second equalizer information stored in the first storage section to the equalizer section, wherein the equalizer section executes the equalizing process based on the first equalizer information or the second equalizer information output from the correcting section.

In the present invention, when first equalizer information is selected and the second headphone the frequency characteristic of which is different from that of the first headphone is used, the first equalizer information, which is generated based on the frequency characteristic of the first headphone, is corrected based on correction information that is the gain difference of the frequency characteristic between the first headphone and the second headphone. The equalizing process is executed based on the corrected first equalizer information. For this reason, even when the second headphone that is different from the first headphone used for generating the first equalizer information is used, the present invention can provide an audio having intended sound quality to the user. Further, when second equalizer information is selected and the first headphone is used, the second equalizer information, which is generated based on the frequency characteristic of the second headphone, is corrected based on correction information. The equalizing process is executed based on the corrected second equalizer information. For this reason, even when the first headphone that is different from the second headphone used for generating the second equalizer information is used, the present invention can provide an audio having intended sound quality to the user.

Preferably, the equalizer apparatus further comprising: a second storage section for storing the correction information.

In the present invention, the equalizer information can be corrected based on stored correction information.

Preferably, the equalizer apparatus further comprising: a third storage section for storing the frequency characteristics of the first headphone and the second headphone; and a correction information generator for generating the correction information based on the frequency characteristics of the first headphone and the second headphone stored in the third storage section.

In the present invention, the equalizer information can be corrected based on the generated correction information.

Preferably, wherein the correction information is related to a predetermined sampling frequency, when a sampling frequency of an audio signal is different from the predetermined sampling frequency, the correcting section generates new correction information related to the sampling frequency of the audio signal based on the correction information.

In the present invention, when a sampling frequency of an audio signal is different from a predetermined sampling frequency, new correction information related to the sampling frequency of the audio signal is generated from the correction information. For this reason, correction information related to a plurality of sampling frequencies does not have to be stored.

Preferably, wherein when the sampling frequency of the audio signal is an integral multiple of the predetermined sampling frequency, the correcting section executes a thinning process on the correction information in a band of a predetermined frequency or less, and adds information for setting 0 dB for a gain in a band larger than the predetermined frequency to the correction information that undergoes the thinning process, so as to generate the new correction information.

According to the present invention, when the sampling frequency of the audio signal is different from the predetermined sampling frequency, new correction information related to the sampling frequency of the audio signal can be generated.

Preferably, wherein when the sampling frequency of the audio signal is not the integral multiple of the predetermined sampling frequency, the correcting section generates interpolation information based on the correction information in a band of a predetermined frequency or less, and adds information for setting 0 dB for a gain in a band larger than the predetermined frequency to the interpolation information, so as to generate the new correction information.

According to the present invention, when the sampling frequency of the audio signal is different from the predetermined sampling frequency, new correction information related to the sampling frequency of the audio signal can be generated.

A storage medium in which an equalizer program is stored, the equalizer program for allowing a computer to function as: a first storage section for storing equalizer information based on a frequency characteristic of a first headphone; an equalizer section for executing an equalizing process for changing a frequency characteristic of an audio signal; and a correcting section for outputting the equalizer information stored in the first storage section to the equalizer section when the first headphone is used, and correcting the equalizer information stored in the first storage section based on correction information that is a gain difference of the frequency characteristic between the first headphone and a second headphone so as to output the corrected equalizer information to the equalizer section when the second headphone the frequency characteristic of which is different from that of the first headphone is used, wherein the equalizer section executes the equalizing process based on the equalizer information output from the correcting section.

A storage medium in which an equalizer program is stored, the equalizer program for allowing a computer to function as; a first storage section for storing first equalizer information based on a frequency characteristic of a first headphone and second equalizer information based on a frequency characteristic of a second headphone different from the frequency characteristic of the first headphone; an equalizer section for executing an equalizing process for changing a frequency characteristic of an audio signal; an accepting section for accepting selection of any one of the first equalizer information and the second equalizer information; and a correcting section for, when the accepting section accepts the selection of the first equalizer information and the first headphone is used, outputting the first equalizer information stored in the first storage section to the equalizer section, when the accepting section accepts the selection of the first equalizer information and the second headphone is used, correcting the first equalizer information stored in the first storage section based on correction information that is a gain difference of the frequency characteristic between the first headphone and the second headphone so as to output the corrected first equalizer information to the equalizer section, when the accepting section accepts the selection of the second equalizer information and the first headphone is used, correcting the second equalizer information stored in the first storage section based on the correction information so as to output the corrected second equalizer information to the equalizer section, when the accepting section accepts the selection of the second equalizer information and the second headphone is used, outputting the second equalizer information stored in the first storage section to the equalizer section, wherein the equalizer section executes the equalizing process based on the first equalizer information or the second equalizer information output from the correcting section.

BRIEF DESCRIPTION OF THE DRAWINGS

FIG. 2 is a diagram illustrating one example of a table in which information about headphones and information about correction curves are related to each other and stored;

FIG. 7 is a diagram illustrating one example of a table in which information about the equalizer curves and information about headphones to be used for generating the equalizer curves are related to each other and are stored;

FIG. 8 is one example of a table where the information about the headphones used for generating the equalizer curves, information about the headphones to be connected to the smartphone, and information about the correction curves related to them are related to each other and are stored;

DETAILED DESCRIPTION OF THE PREFERRED EMBODIMENT

Figure 1:
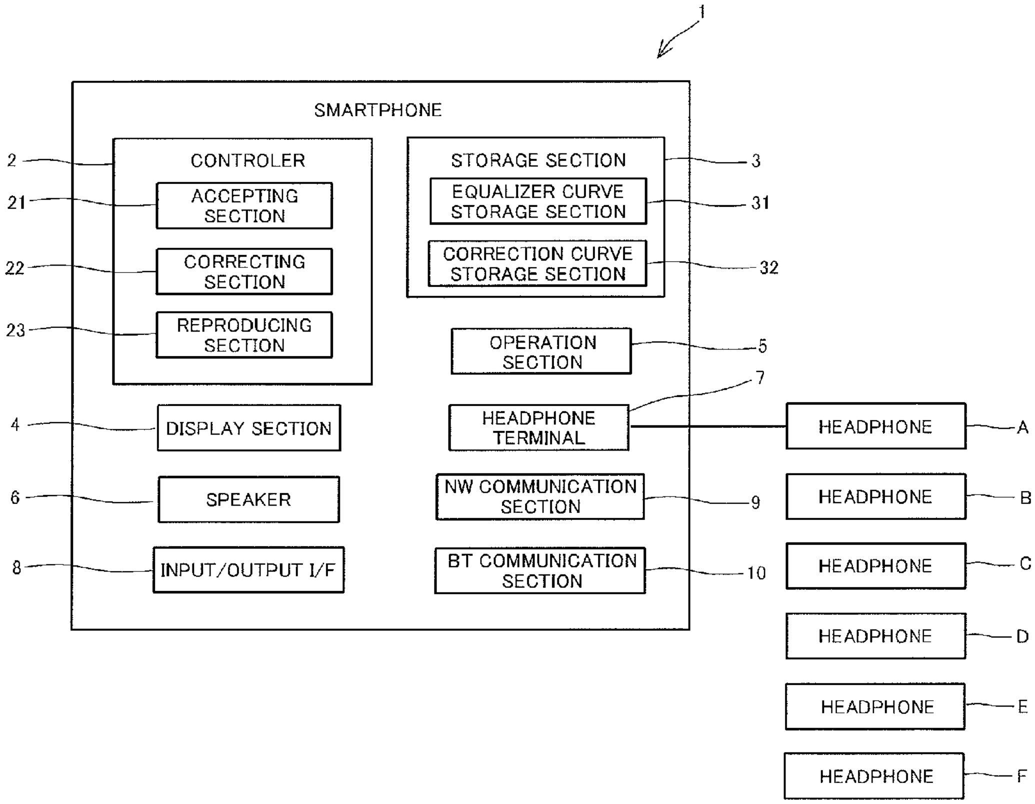
FIG. 1 is a block diagram illustrating a constitution of a smartphone according to a first embodiment of the present invention.

A first embodiment of the present invention is described below. FIG. 1 is a block diagram illustrating a constitution of a smartphone according to the first embodiment. A smartphone 1 functions as an equalizer apparatus for executing an equalizing process for changing a frequency characteristic of an audio signal in a manner that a music reproducing program (equalizer program) stored in a storage section 3 is executed. As shown in FIG. 1, the smartphone 1 includes a controller 2, the storage section 3, a display section 4, an operating section 5, a speaker 6, a headphone terminal 7, an input/output interface (hereinafter, "input/output I/F") 8, a network communication section (hereinafter, "NW communication section") 9, and a Bluetooth (registered trademark) communication section (hereinafter, "BT communication section") 10. The smartphone 1 is connected to headphones A to F via the headphone terminal 7, and outputs an audio signal to the headphones A to F. "The headphone" is not limited to overhead type and neck-band type headphones and is a concept including an inner-ear type headphone that is called an earphone. The music reproducing program may be stored in the storage section 3 of the smartphone 1 at factory shipment, or may be downloaded from a server, not shown, via the NW communication section 9, described later, and stored in the storage section 3 of the smartphone 1.

The controller 2 controls respective sections composing the smartphone 1 according to an OS (Operating System) program or an application program, and functions as a reproducing section 23, described later. The respective function sections such as the reproducing section 23 may be constituted by an electronic circuit specialized for an arithmetic process in the respective function sections, or may have another constitution. The controller 2 is described later.

The storage section 3 is composed of a RAM (Random Access Memory) that functions as a main memory of the controller 2, a ROM (Read Only Memory) for storing a control program, and a flash memory for storing programs such as application programs including an OS program and the music reproducing program, and various files such as music files. The storage section 3 is not limited to the illustrated constitution, and may include an HDD (Hard Disk Drive).

Further, the storage section 3 functions as an equalizer curve storage section 31 (first storage section) for storing a plurality of equalizer curves (equalizer information), and a correction curve storage section 32 (second storage section) for storing a plurality of correction curves (correction information). The equalizer curve is for executing the equalizing process according to genres such as Rock, Pops, and Jazz, and represents a gain with respect to a frequency. In this embodiment, for example, an equalizer curve is generated based on a frequency characteristic of the headphone A. The correction curve is for correcting the equalizer curve. As shown in FIG. 2, the correction curves are related to the headphones B to F other than the headphone A that generates the equalizer curve, and headphone information ("headphone information" field) and correction curve information ("correction curve information" field) are related to each other so as to be stored. The number of the correction curves to be stored in the correction curve storage section 32 is not limited to five.

Figure 3:
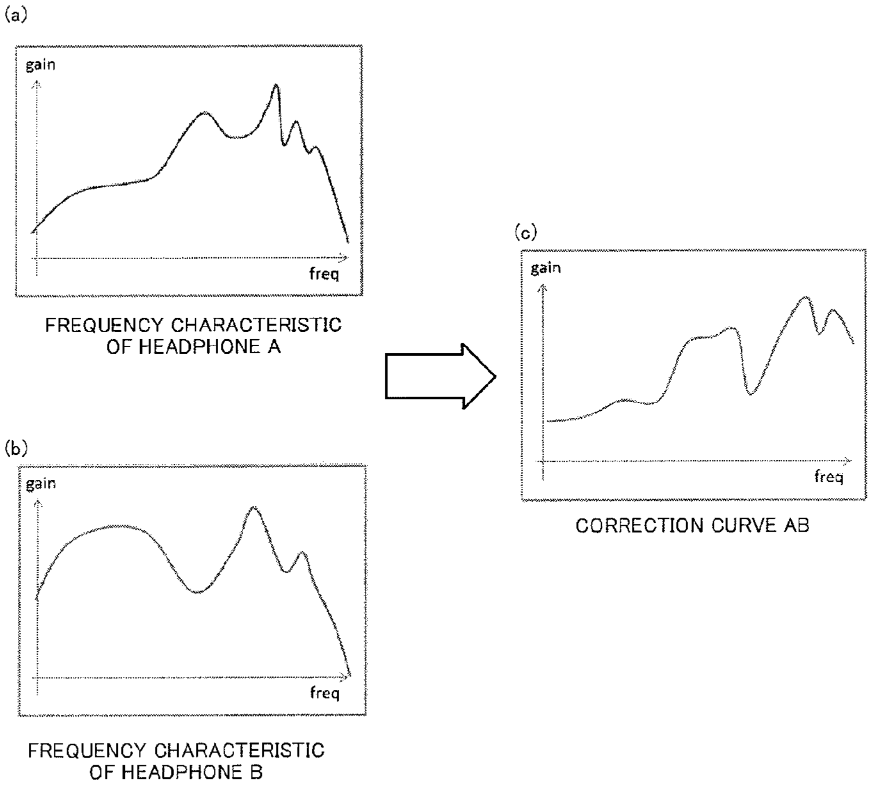
FIGS. 3(*a*) to 3(*c*) are diagrams describing the correction curves.

The correction curve is described with reference to FIGS. 3(*a*) to 3(*c*). FIG. 3(*a*) illustrates a frequency characteristic of the headphone A, FIG. 3(*b*) illustrates a frequency characteristic of the headphone B, and FIG. 3(*c*) illustrates a correction curve AB related to the headphone B. In FIGS. 3(*a*) to 3(*c*), a vertical axis represents a gain (gain), and a horizontal axis represents a frequency (freq). The correction curve AB represents a gain difference in the frequency characteristic between the headphone A and the headphone B. Here, the correction curve AB represents a difference of a gain of the headphone B with respect to a gain of the headphone A (the gain of the headphone A−the gain of the headphone B). For example, at a frequency where the gain of the headphone A is larger than the gain of the headphone B, a gain difference obtains a plus value. On the contrary, at a frequency where the gain of the headphone A is smaller than the gain the headphone B, the gain difference obtains a minus value. The correction curve AB related to the headphone B is described above, but much the same is true on the correction curves related to the other headphones, and it represents the gain difference in frequency characteristic between the headphone A and the other headphones. For example, a correction curve AC represents a gain difference of the headphone C with respect to the gain of the headphone A. The respective correction curves are related to a sampling frequency of 44.1 kHz.

The display section 4 displays various images (includes still images and moving images), and is composed of a liquid crystal panel. The operating section 5 has operation keys for performing various settings, and a touch panel that is linked with the display section 4. A user can input various characters such as telephone numbers and mail addresses and perform communication setting via the operating section 5. The speaker 6 outputs various audios such as a voice communication sound based on an audio signal. The headphone terminal 7 is for connecting the headphones A to F, and an audio signal is output to the headphones A to F via the headphone terminal 7. The input/output I/F 8 functions as an interface for data communication between the smartphone 1 and a peripheral device, not shown.

The NW communication section 9 can be connected to an internet via a mobile phone network and a mobile phone base station, not shown. The smartphone 1 can telephone and communicate with another terminal via the NW communication section 9. When new equalizer curve and correction curve are uploaded in a server, not shown, the controller 2 downloads the equalizer curve and the correction curve via the NW communication section 9, and stores them in the storage section 3 (the equalizer curve storage section 31 and the correction curve storage section 32). As a result, for example, an equalizer curve that is not included at the time of the storage in the storage section 3 of the music reproducing program, and a correction curve related to an yet-unreleased headphone can be added. Further, when the equalizer curve stored in the storage section 3, the equalizer curve obtained by updating the correction curve, and the correction curve are uploaded in the server, the controller 2 downloads the equalizer curve and the correction curve via the NW communication section 9, and rewrites the equalizer curve and the correction curve stored in the storage section 3 (the equalizer curve storage section 31 and the correction curve storage section 32).

The BT communication section 10 wirelessly communicates with a peripheral device, not shown, that supports the Bluetooth standards based on the Bluetooth standards.

Figure 4:
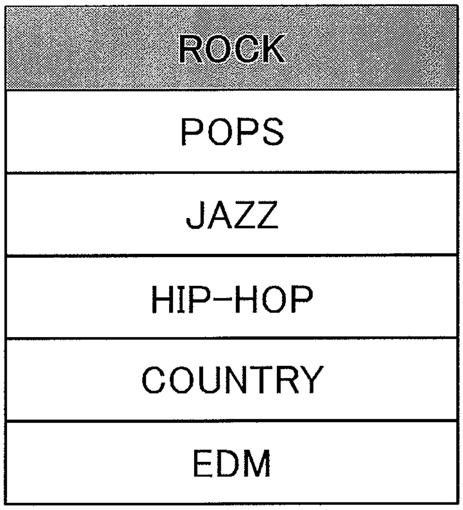
FIG. 4 is a diagram illustrating one example of information about equalizer curve displayed on a display section.

The controller 2 is described below. The controller 2 functions as an accepting section 21, a correcting section 22, and the reproducing section 23 (equalizer section). The accepting section 21 accepts selection of the headphones A to F to be connected to the smartphone 1 and the equalizer curve to be used for the equalizing process. For example, the accepting section 21 displays information about genres such as Rock, Pops, and Jazz on the display section 4 as shown in FIG. 4. The user touches the display section 4 so as to be capable of selecting the equalizer curve of a desired genre. When the display section 4 is touched by the user, the accepting section 21 accepts the selection of the equalizer curve displayed on a touched region. When, for example, a region indicating "Rock" is touched, the accepting section 21 inverts the display of the "Rock" region so as to notify the user of acceptance of the selection of "rock" as shown in FIG. 4. Further, the accepting section 21 outputs information about the equalizer curve the selection of which is accepted to the correcting section 22.

Figure 5:
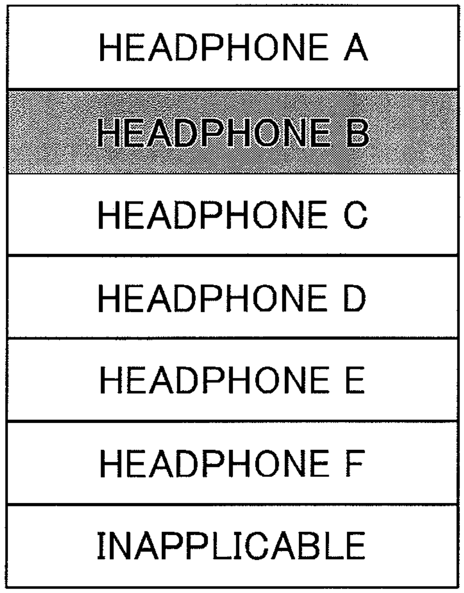
FIG. 5 is a diagram illustrating one example of information about a headphone displayed on the display section.

Further, the accepting section 21 displays information about the headphone A, the headphone B, and the headphone C on the display section 4, for example, as shown in FIG. 5. When the user touches the display section 4, the user can select a headphone to be used (connected to the smartphone 1). When the display section 4 is touched by the user, the accepting section 21 accepts selection of a headphone displayed on the touched region (when "not applicable" is touched, selection of no applicable headphone is included). For example, when a region indicating "the headphone B" is touched, the accepting section 21 inverts the display of the region of "the headphone B" so as to notify the user of the acceptance of the selection of "the headphone B" as shown in FIG. 5. The accepting section 21 outputs the information about the headphone the selection of which is accepted to the correcting section 22.

The correcting section 22 outputs the equalizer curve to the reproducing section 23 for the equalizing process to be executed by the reproducing section 23, described later. The equalizer curve is generated based on the frequency characteristic of the headphone A, and is stored in the equalizer curve storage section 31 as described above. For this reason, when any one of the headphones B to F other than the headphone A is connected to the smartphone 1, the frequency characteristics are different between the headphone A and the headphones B to F. For this reason, when the equalizing process is executed by using the equalizer curve stored in the equalizer curve storage section 31, an audio that is heard by the user does not have intended sound quality.

For this reason, when the headphone to be connected to the smartphone 1 (the accepting section 21 accepts the selection) is any one of the headphones B to F other than the headphone A, the correcting section 22 corrects the equalizer curve stored in the equalizer curve storage section 31 based on the correction curves AB to AF that is gain differences in the frequency characteristics between the headphone A and the headphones B to F. Concretely, the correcting section 22 synthesizes the equalizer curve with the correction curve. In other words, the correcting section 22 adds the equalizer curve and the correction curve. For example, when the equalizer curve is synthesized with the correction curve AB, the gain difference obtains a plus value at the frequency where the gain of the headphone A is larger than the gain of the headphone B, and thus the gain of the equalizer curve increases. On the contrary, the gain difference obtains a minus value at the frequency where the gain of the headphone A is smaller than the gain of the headphone B, and thus the gain of the equalizer curve decreases.

Further, when the headphone to be connected to the smartphone 1 (the accepting section 21 accepts the selection) is the headphone A, the correcting section 22 does not have to correct the equalizer curve, and thus outputs the equalizer curve stored in the equalizer curve storage section 31 to the reproducing section 23. In this embodiment, when the headphone to be connected to the smartphone 1 is the headphone A, the correcting section 22 generates a flat correction curve where the gain is 0 dB. Further, also when the headphone to be connected to the smartphone 1 is a headphone other than the headphones B to F, the correcting section 22 generates a flat correction curve where the gain is 0 dB. The correcting section 22 synthesizes the equalizer curve with the flat correction curve. In this case, since the correction curve is flat, the equalizer curve does not change. The case where correcting section 22 generates the flat correction curve and the equalizer curve is synthesized with the flat correction curve is described here, but the equalizer curve stored in the equalizer curve storage section 31 may be directly output to the reproducing section 23. Further, the flat correction curve is stored as the correction curve related to the headphone A in the correction curve storage section 31, and the equalizer curve may be synthesized with the correction curve. Much the same is true on the case where the headphone to be connected to the smartphone 1 is a headphone other than the headphones B to F.

The reproducing section 23 reads a music file selected by the user from the storage section 3, and executes reproducing processes such as a decoding process, the equalizing process, a D/A converting process, and a volume adjusting process on the read music file, and outputs an audio signal to the headphone terminal 7. In the equalizing process, the reproducing section 23 executes the equalizing process based on the equalizer curve output from the correcting section 22.

Figure 6:
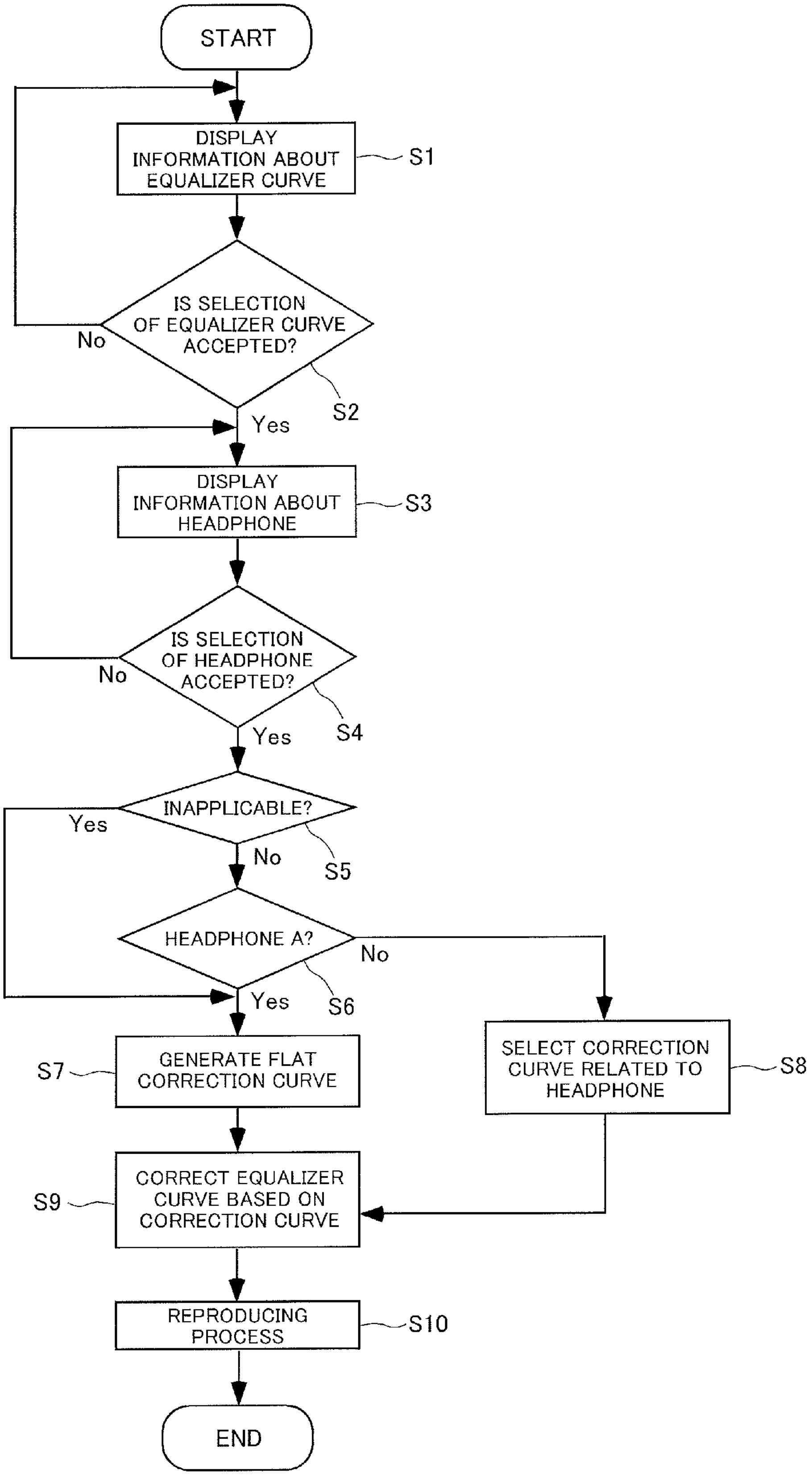
FIG. 6 is a flowchart illustrating a processing operation of the smartphone in a case where a music reproducing program is executed in the first embodiment.

In this embodiment, a processing operation of the smartphone 1 in a case where the music reproducing program stored in the storage section 3 is executed is described with reference to a flowchart shown in FIG. 6. The accepting section 21 displays information about the equalizer curves on the display section 4 (S1, see FIG. 4). The accepting section 21 determines whether it accepts the selection of the equalizer curve (S2). While the accepting section 21 determines that it does not accept the selection of the equalizer curve (S2: No), it displays the information about the equalizer curve on the display section 4 (S1).

When the accepting section 21 determines that it accepts the selection of the equalizer curve (S2: Yes), it displays the information about a headphone on the display section 4 (S3, see FIG. 5). The accepting section 21, then, determines whether it accepts the selection of the headphone (S4). While the accepting section 21 determines that it does not accept the selection of the headphone (S4: No), it displays the information about the headphones on the display section 4 (S3).

When the accepting section 21 determines that it accepts the selection of the headphone (S4: Yes), the correcting section 22 determines whether the headphone the selection of which is accepted by the accepting section 21 is inapplicable based on the information output from the accepting section 21 (S5). When the correcting section 22 determines that the headphone the selection of which is accepted by the accepting section 21 is not inapplicable (S5: No), the correcting section 22 then determines whether the headphone the selection of which is accepted by the accepting section 21 is the headphone A based on the information output from the accepting section 21 (S6). When the correcting section 22 determines that the headphone the selection of which is accepted by the accepting section 21 is inapplicable (S5: Yes) or the headphone the selection of which is accepted by the accepting section 21 is the headphone A (S6: Yes), it generates the flat correction curve (S7). When the correcting section 22 determines that the headphone the selection of which is accepted by the accepting section 21 is not the headphone A, namely, is any one of the headphones B to F (S6: No), it selects any one of the correction curves AB to AF stored in the correction curve storage section 32 related to any one of the headphones B to F the selection of which is accepted by the accepting section 21 (S8). The correcting section 22 corrects the equalizer curve the selection of which is accepted by the accepting section 21 at S2 based on the correction curve generated at S7 or the correction curve selected at S8 (S9). The reproducing section 23 executes the reproducing process on the music file selected by the user (S10). At this time, the reproducing section 23 executes the equalizing process based on the equalizer curve corrected by the correcting section 22 at S9.

As described above, in this embodiment, when the frequency characteristic of the headphone A is different from those of the headphones B to F, the correcting section 22 corrects the equalizer curve, which is generated based on the frequency characteristic of the headphone A, based on the correction curves AB to AF that are gain differences of the frequency characteristics between the headphone A and the headphones B to F. The reproducing section 23 executes the equalizing process based on the corrected equalizer curve. For this reason, even when the headphones B to F that are different from the headphone A used for generating are used, the smartphone 1 can provide intended sound quality to the user.

A second embodiment of the present invention is described below. In this embodiment, the equalizer curves according to genres are generated based on frequency characteristics of various headphones. For example, as shown in FIG. 7, the equalizer curves of the genre "Rock" is generated based on the frequency characteristic of the headphone A, the equalizer curve of the genre "Pops" is generated based on the frequency characteristic of the headphone B, and the equalizer curve of the genre "Jazz" is generated based on the frequency characteristic of the headphone C. As shown in FIG. 7, the information about the equalizer curves ("equalizer information" field) and the information about the headphones used for generating the equalizer curves ("headphone information" field) are related with each other so as to be stored in the storage section 3.

Further, since a plurality of headphones is used for generating the equalizer curves, correction curves the number of which is the same as the number of combinations of the headphone used for generating the equalizer curve and the headphone to be connected to the smartphone 1 are stored in the correction curve storage section 32. For example, when the three headphones A, B, and C are used for generating the equalizer curves and the three headphones A, B, and C are connected to the smartphone 1, as shown in FIG. 8, six correction curves AB, AC, BA, BC, CA, and CB are stored in the correction curve storage section 32. As shown in FIG. 8, the information about the headphones used for generating the equalizer curves ("headphone information 1" field), information about the headphones to be connected to the smartphone 1 ("headphone information 2" field), and information about correction curves related to these headphones ("correction curve information" field) are related to each other so as to be stored in the storage section 3.

When the headphone used for generating the equalizer curve to be used by the reproducing section 23 for the equalizing process does not match with the headphone to be connected to the smartphone 1, the correcting section 22 corrects the equalizer curve based on the correction curve. For example, when the equalizer curve to be used for the equalizing process is "Pops", the headphone B is used for generating the equalizer curve (see FIG. 7). When the headphone to be connected to the smartphone 1 is the headphone C, the headphones do not match. In such a case, the correcting section 22 corrects the equalizer curve of "Pops" based on the correction curve BC where the "headphone information 1" field indicates the headphone B and the "headphone information 2" field indicates the headphone C as shown in the table of FIG. 8.

Figure 9:
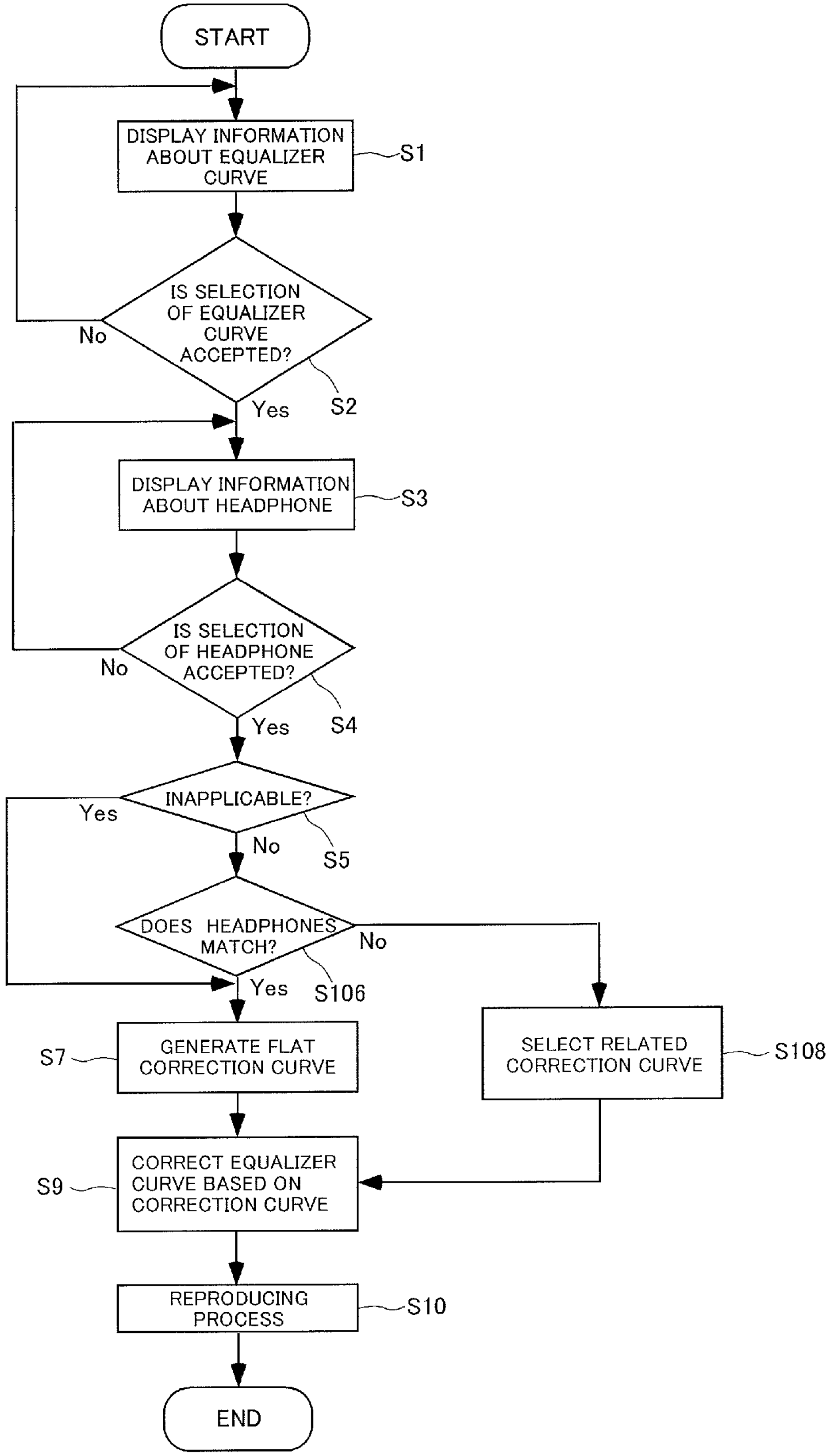
FIG. 9 is a flowchart illustrating the processing operation of a smartphone in the case where a music reproducing program is executed in a second embodiment.

In this embodiment, the processing operation of the smartphone 1 in the case where the music reproducing program stored in the storage section 3 is executed is described with reference to a flowchart shown in FIG. 9. Since the process at S1 to S5 is the same as the processing operation in the first embodiment shown in FIG. 6, the description thereof is omitted. When the correcting section 22 determines that the headphone the selection of which is received by the accepting section 21 is not inapplicable (S5: No), it determines whether the headphone used for generating the equalizer curve and the selection of which is accepted by the accepting section 21 at S2 matches with the headphone the selection of which is accepted by the accepting section 21 at S4 based on the table shown in FIG. 7 (S106). When the correcting section 22 determines that the headphone the selection of which is accepted by the accepting section 21 is inapplicable (S5: Yes) or determines that the headphone used for generating the equalizer curve the selection of which is accepted by the accepting section 21 at S2 matches with the headphone the selection of which is accepted by the accepting section 21 at S4 (S106: Yes), it does not have to correct the equalizer curve, and thus generates a flat correction curve (S7). When the correcting section 22 determines that the headphone used for generating the equalizer curve the selection of which is accepted by the accepting section 21 at S2 does not match with the headphone the selection of which is accepted by the accepting section 21 at S4 (S106: No), it selects a related correction curve based on the table shown in FIG. 8 (S108). The correcting section 22 corrects the equalizer curve the selection of which is accepted by the accepting section 21 at S2 based on the correction curve generated at S7 or the correction curve selected at S108 (S9). The reproducing section 23 executes the reproducing process on the music file selected by the user (S10). At this time, the reproducing section 23 executes the equalizing process based on the equalizer curve corrected by the correcting section 22 at S9.

As described above, in this embodiment, when, for example, the equalizer curve of "Rock" is selected and the headphone B the frequency characteristic of which is different from that of the headphone A used for generating the equalizer curve of "Rock" is used, the correcting section 22 corrects the equalizer curve of "Rock", which is generated based on the frequency characteristic of the headphone A, based on the correction curve AB that is the gain difference of the frequency characteristic between the headphone A and the headphone B. The reproducing section 23 executes the equalizing process based on the corrected equalizer curve of "Rock". For this reason, even when the headphone B that is different from the headphone A used for generating the equalizer curve of "Rock" is used, the smartphone 1 can provide intended sound quality to the user.

For example, when the equalizer curve of "Pops" is selected and the headphone C the frequency characteristic of which is different from that of the headphone B used for generating the equalizer curve B of "Pops" is used, the correcting section 22 corrects the equalizer curve of "Pops", which is generated based on the frequency characteristic of the headphone B, based on the correction curve BC that is the gain difference of the frequency characteristic between the headphone B and the headphone C. The reproducing section 23 executes the equalizing process based on the corrected equalizer curve of "Pops". For this reason, even when the headphone C that is different from the headphone B used for generating the equalizer curve of "Pops" is used, the smartphone 1 can provide an audio having intended sound quality to the user.

Figure 10:
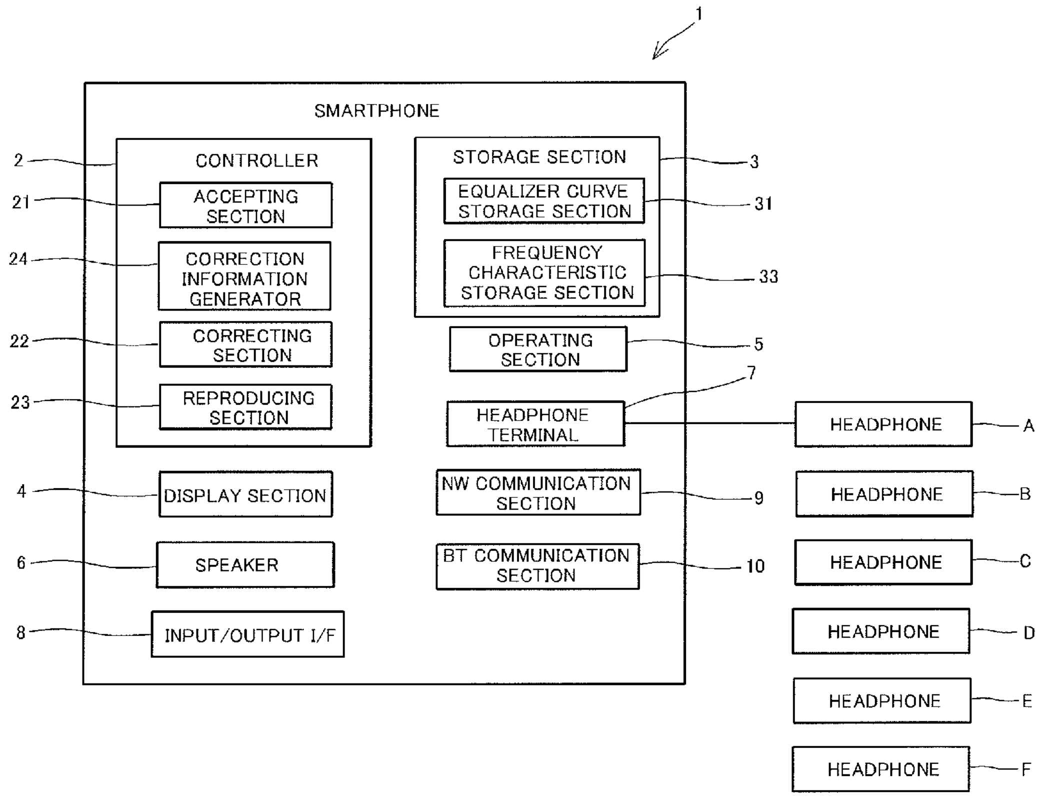
FIG. 10 is a block diagram illustrating the constitution of a smartphone according to a third embodiment of the present invention.

A third embodiment of the present invention is described below. A constitution that is different from the first embodiment is described below. FIG. 10 is a block diagram illustrating the constitution of the smartphone 1 according to the third embodiment. In the third embodiment, the controller 2 functions as not only the accepting section 21, the correcting section 22, and the reproducing section 23 but also a correction curve generator 24 (correction information generator) for generating a correction curve. The storage section 3 stores the frequency characteristic related to the headphones A to F instead of the correction curves, and functions as the equalizer curve storage section 31, and a frequency characteristic storage section 33 (third storage section).

The correction curve generator 24 generates a correction curve based on the frequency characteristics of the headphones B to F stored in the frequency characteristic storage section 33. For example, when the correction curve AB is generated, the gain of the headphone B is subtracted from the gain of the headphone A (the gain of the headphone A−the gain of the headphone B), and the correction curve AB is generated. In this embodiment, the equalizer curve can be corrected based on the correction curve generated by the correction curve generator 24.

A fourth embodiment of the present invention is described below. In the fourth embodiment, when a sampling frequency of an audio signal (music file) is different from a sampling frequency of 44.1 kHz related to the correction curve, the correcting section 22 generates a new correction curve related to the sampling frequency of the audio signal based on the correction curve.

Figure 11:
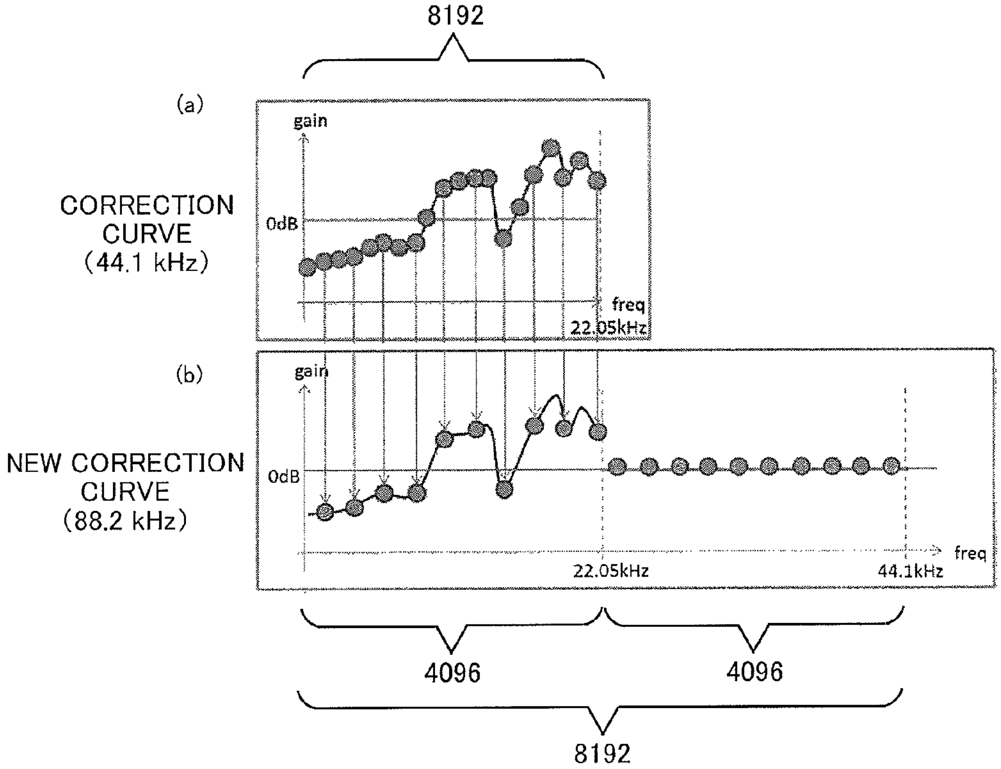
FIGS. 11(*a*) and 11(*b*) are diagrams describing generation of a new correction curve based on the correction curve.

A case where the sampling frequency of the audio signal is the integral multiple of the sampling frequency related to the correction curve is described with reference to FIGS. 11(*a*) and 11(*b*). A case where the sampling frequency of the audio signal is 88.2 kHz that is twice as large as the sampling frequency of 44.1 kHz related to the correction curve is described. FIG. 11(*a*) illustrates the correction curve related to the sampling frequency of 44.1 kHz, and FIG. 11(*b*) illustrates a new correction curve related to the sampling frequency of 88.2 kHz. The correcting section 22 executes a thinning process on data of the correction curve in a band of not more than 22.05 kHz that is a predetermined frequency. When the sampling frequency of the audio signal is the integral multiple, since a frequency interval of the data of the new correction curve related to the audio signal the sampling frequency of which is the integral multiple is also the integral multiple with respect to a frequency interval of the data of the correction curve, the correction curve can be thinned to be used. Since the sampling frequency of the audio signal is twice as large as the sampling frequency related to the correction curve, the thinning process is executed so that 8192 data is thinned to 4096 data in a band of 22.05 kHz or less. The correcting section 22 adds data where the gain in a band larger than 22.05 kHz is set to 0 dB to the correction curve on which the thinning process is executed. At this time, 4096 data is added at the same interval as the frequency interval of the data of the correction curve on which the thinning process is executed. The correcting section 22 generates the new correction curve based on the correction curve in such a manner.

Figure 12:
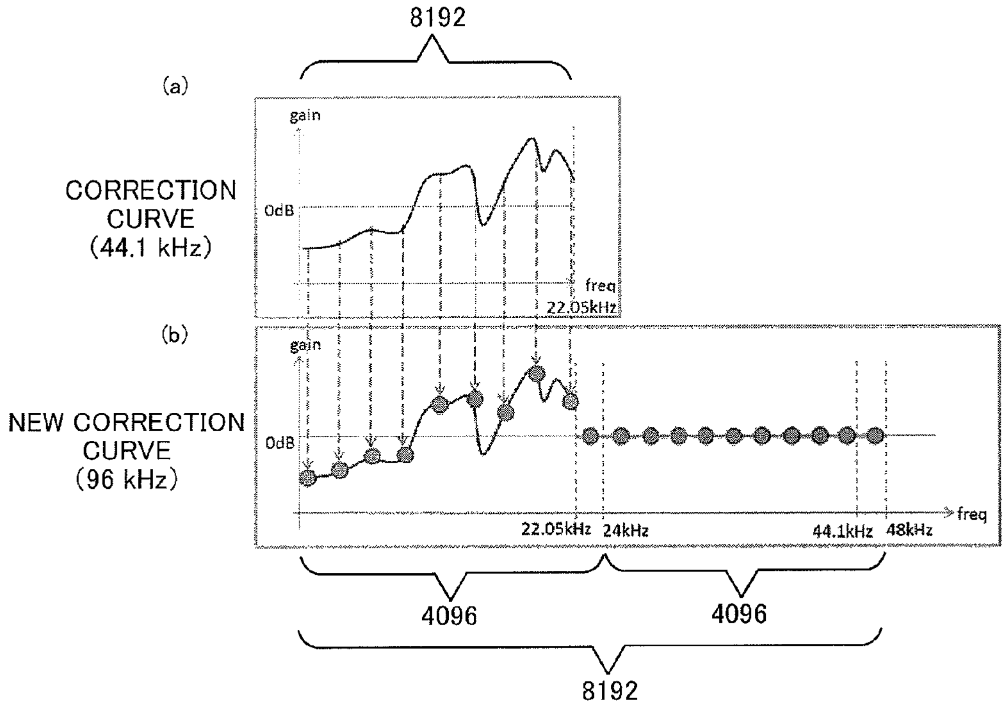
FIGS. 12(*a*) and 12(*b*) are diagrams describing generation of a new correction curve base on the correction curve.

The case where the sampling frequency of the audio signal is not the integral multiple of a sampling frequency related to the correction curve is described with reference to FIGS. 12(*a*) and 12(*b*). A case where the sampling frequency of the audio signal is 96 kHz that is not the integral multiple of the sampling frequency 44.1 kHz related to the correction curve is described here. FIG. 12(*a*) illustrates a correction curve related to the sampling frequency 44.1 kHz, and FIG. 12(*b*) illustrates a new correction curve related to the sampling frequency 96 kHz. The correcting section 22 generates interpolation data based on the correction curve in the band of 22.05 kHz or less that is a predetermined frequency. When the sampling frequency of the audio signal is not the integral multiple, the frequency interval of data of a new correction curve, which is related to the audio signal the sampling frequency of which is not the integral multiple, is also not the integral multiple with respect to the frequency interval of the data of the correction curve, and thus the correction curve cannot be used. The generation of the interpolation data is performed by extracting predetermined data positioned on the correction curve. The correcting section 22 adds data where a gain in a band larger than 22.05 kHz is set to 0 dB to the interpolation data. At this time, the data is added at the same interval as the frequency interval of the interpolation data so that the number of data becomes 4096 in a band of 24 kHz or less and becomes 4096 in a band larger than 24 kHz. The correcting section 22 generates the new correction curve based on the correction curve in such a manner.

Figure 13:
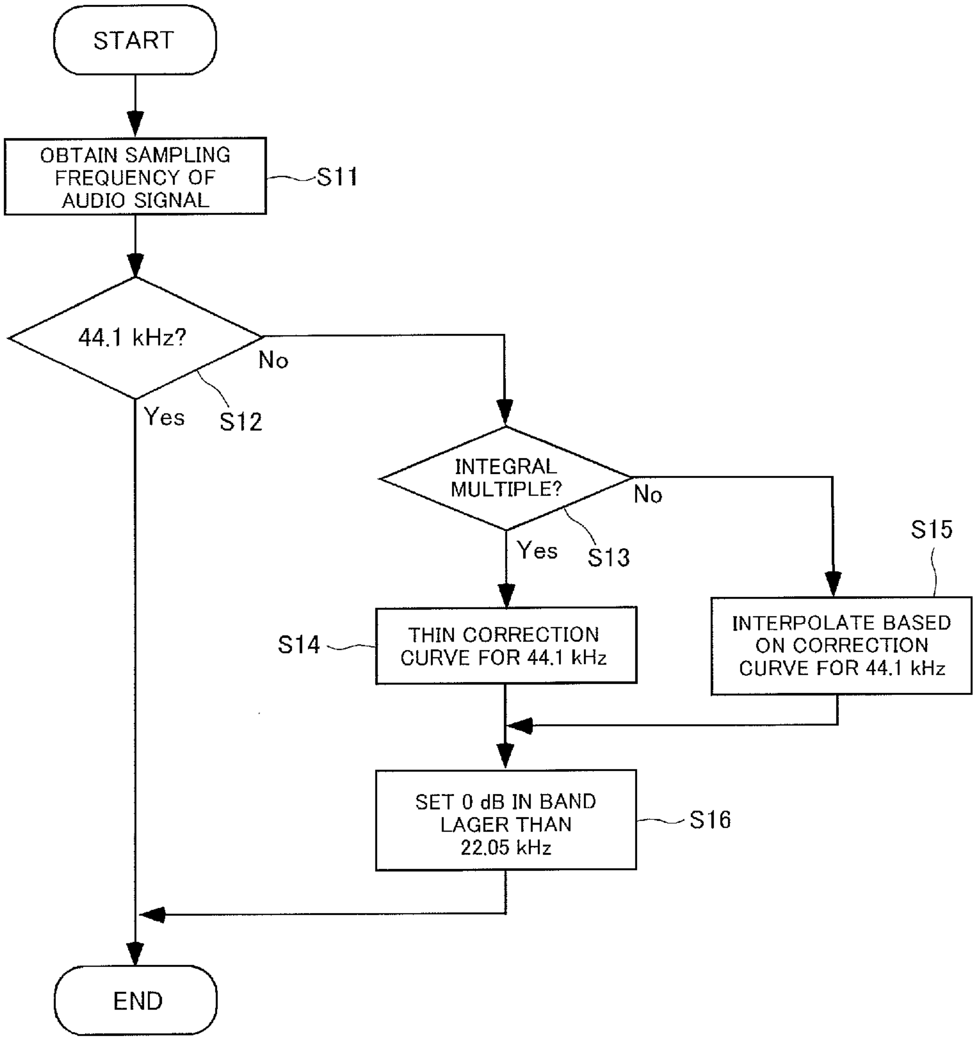
FIG. 13 is a flowchart illustrating the processing operation of the smartphone in the case where a new correction curve is generated based on the correction curves.

The processing operation of the smartphone 1 in a case where a new correction curve is generated based on the correction curve is described below based on a flowchart shown in FIG. 13. This process is executed, for example, at S8 in the flowchart shown in FIG. 6, after the process at S108 and before the process at S9 in the flowchart shown in FIG. 9. The correcting section 22 obtains the sampling frequency of the audio signal (S11). The correcting section 22 determines whether the sampling frequency of the audio signal is 44.1 kHz (S12). When the correcting section 22 determines that the sampling frequency of the audio signal is 44.1 kHz (S12: Yes), it does not have to generate a new correction curve based on the correction curve, the process is ended.

When the correcting section 22 determines that the sampling frequency of the audio signal is not 44.1 kHz (S12: No), it determines whether the sampling frequency of the audio signal is the integral multiple of 44.1 kHz (S13). When the correcting section 22 determines that the sampling frequency of the audio signal is the integral multiple of 44.1 kHz (S13: Yes), it executes the thinning process on the data of the correction curve in the band of 22.05 kHz or less (S14). On the other hand, when the correcting section 22 determines that the sampling frequency of the audio signal is not the integral multiple of 44.1 kHz (S13: No), it generates interpolation data based on the correction curve in the band of 22.05 kHz or less (S15). The correcting section 22 adds data for setting the gain to 0 dB in the band larger than 22.05 kHz to the correction curve subject to the thinning process at S14 or the interpolation data generated at S15, so as to generate a new correction curve (S16).

In this embodiment, when the sampling frequency of the audio signal is different from the predetermined sampling frequency (44.1 kHz), the correcting section 22 generates a new correction curve related to the sampling frequency of the audio signal based on the correction curve. For this reason, correction curves related to a plurality of sampling frequencies do not have to be stored.

The embodiments of the present invention are described above, the mode to which the present invention is applicable is not limited to the above embodiments and can be suitably varied without departing from the scope of the present invention as described above.

In the above embodiments, the accepting section 21 accepts the selection of the equalizer curve, but in addition to this, it may accept editing of the equalizer curve. In this case, the accepting section 21 accepts editing of the equalizer curve corrected by the correcting section 22, and may store the edited equalizer curve in the equalizer curve storage section 31.

In the above embodiment, an amount of correction of the equalizer curve performed by the correcting section 22 based on the correction curve is not limited, but when the correction amount is large, the audio signal is occasionally clipped (distorted). For this reason, an upper limit of the correction amount is provided, and when the correction amount exceeds the upper limit, it may be normalized (cutting boost). Further, in spectrum display, a portion that is cutting boost in the equalizing process may be distinguished from the other portions by a color so that cutting boost amount is visually recognized.

Further, in the correction curve, when a plurality of dips is present in a high band, the band is likely to fluctuate due to a measurement error, and thus the correction curve may be smoothened.

In the above embodiments, the smartphone 1 is connected to the headphones A to F with wire via the headphone terminal 7. Not limited to this, in a case of a wireless headphone compatible with Bluetooth standards, for example, the smartphone 1 may be wirelessly connected to the headphone via the BT communication section 10. In this case, when the smartphone 1 is pared with the headphone, the information about the headphone to be connected is obtained by the smartphone 1. For this reason, the correcting section 22 can select the correction curve so as to correct the equalizer curve based on this information.

The above embodiments describe the case where the equalizer program for making the smartphone 1 function as an equalizer apparatus is incorporated into the music reproducing program. Not limited to this, the music reproducing program for reproducing a music file may be separated from the equalizer program.

The above embodiments describe the case where the music reproducing program is installed into the smartphone and the smartphone is made to function as the equalizer apparatus. Not limited to this, the device that is made to function as the equalizer apparatus may be a Tablet PC, a feature phone, a mobile media player, and a mobile game machine.

The present invention can be suitably employed in a music reproducing apparatus and the music reproducing program for reproducing music.

What is claimed is:

1. An equalizer apparatus comprising:
- a first storage section having stored therein equalizer information based on a frequency characteristic of a first headphone;
- a second storage section having stored therein correction information that is a gain difference of the frequency characteristic between the first headphone and a second headphone the frequency characteristic of which is different from that of the first headphone;
- an equalizer section for executing an equalizing process for changing a frequency characteristic of an audio signal; and
- a correcting section for outputting the equalizer information stored in the first storage section to the equalizer section when the first headphone is used, and correcting the equalizer information stored in the first storage section by adding the correction information stored in the second storage section to the equalizer information stored in the first storage section so as to output the corrected equalizer information to the equalizer section when the second headphone is used, wherein
- the equalizer section executes the equalizing process based on the equalizer information output from the correcting section.

2. An equalizer apparatus comprising:
- a first storage section having stored therein first equalizer information based on a frequency characteristic of a first headphone, and second equalizer information based on a frequency characteristic of a second headphone different from the frequency characteristic of the first headphone;
- a second storage section having stored therein first correction information that is a gain difference of the frequency characteristic between the first headphone and the second headphone, and second correction information that is a gain difference of the frequency characteristic between the second headphone and the first headphone;
- an equalizer section for executing an equalizing process for changing a frequency characteristic of an audio signal;
- an accepting section for accepting selection of any one of the first equalizer information and the second equalizer information; and
- a correcting section for, when the accepting section accepts the selection of the first equalizer information and the first headphone is used, outputting the first equalizer information stored in the first storage section to the equalizer section,
- when the accepting section accepts the selection of the first equalizer information and the second headphone is used, correcting the first equalizer information stored in the first storage section by adding the first correction information stored in the second storage section to the first equalizer information so as to output the corrected first equalizer information to the equalizer section, when the accepting section accepts the selection of the second equalizer information and the first headphone is used, correcting the second equalizer information stored in the first storage section by adding the second correction information stored in the second storage section to the second equalizer information so as to output the corrected second equalizer information to the equalizer section, when the accepting section accepts the selection of the second equalizer information and the second headphone is used, outputting the second equalizer information stored in the first storage section to the equalizer section, wherein the equalizer section executes the equalizing process based on the first equalizer information or the second equalizer information output from the correcting section.

3. The equalizer apparatus according to claim 1, further comprising: a third storage section for storing the frequency characteristics of the first headphone and the second headphone; and a correction information generator for generating the correction information based on the frequency characteristics of the first headphone and the second headphone stored in the third storage section.

4. The equalizer apparatus according to claim 1, wherein the correction information is related to a predetermined sampling frequency, when a sampling frequency of an audio signal is different from the predetermined sampling frequency, the correcting section generates new correction information related to the sampling frequency of the audio signal based on the correction information.

5. The equalizer apparatus according to claim 4, wherein when the sampling frequency of the audio signal is an integral multiple of the predetermined sampling frequency, the correcting section executes a thinning process on the correction information in a band of a predetermined frequency or less, and adds information for setting 0 dB for a gain in a band larger than the predetermined frequency to the correction information that undergoes the thinning process, so as to generate the new correction information.

6. The equalizer apparatus according to claim 4, wherein when the sampling frequency of the audio signal is not the integral multiple of the predetermined sampling frequency, the correcting section generates interpolation information based on the correction information in a band of a predetermined frequency or less, and adds information for setting 0 dB for a gain in a band larger than the predetermined frequency to the interpolation information, so as to generate the new correction information.

7. A computer-readable non-transitory storage medium in which an equalizer program is stored, the equalizer program for allowing a computer to function as:

a first storage section having stored therein equalizer information based on a frequency characteristic of a first headphone;

a second storage section having stored therein correction information that is a pain difference of the frequency characteristic between the first headphone and a second headphone the frequency characteristic of which is different from that of the first headphone;

an equalizer section for executing an equalizing process for changing a frequency characteristic of an audio signal; and a correcting section for outputting the equalizer information stored in the first storage section to the equalizer section when the first headphone is used, and correcting the equalizer information stored in the first storage section by adding the correction information stored in the second storage section to the equalizer information stored in the first storage section so as to output the corrected equalizer information to the equalizer section when the second headphone is used, wherein the equalizer section executes the equalizing process based on the equalizer information output from the correcting section.

8. A computer-readable non-transitory storage medium in which an equalizer program is stored, the equalizer program for allowing a computer to function as;

a first storage section having stored therein first equalizer information based on a frequency characteristic of a first headphone and second equalizer information based on a frequency characteristic of a second headphone different from the frequency characteristic of the first headphone;

a second storage section having stored therein first correction information that is a gain difference of the frequency characteristic between the first headphone and the second headphone, and second correction information that is a gain difference of the frequency characteristic between the second headphone and the first headphone;

an equalizer section for executing an equalizing process for changing a frequency characteristic of an audio signal;

an accepting section for accepting selection of any one of the first equalizer information and the second equalizer information; and a correcting section for, when the accepting section accepts the selection of the first equalizer information and the first headphone is used, outputting the first equalizer information stored in the first storage section to the equalizer section, when the accepting section accepts the selection of the first equalizer information and the second headphone is used, correcting the first equalizer information stored in the first storage section by adding the first correction information stored in the second storage section to the first equalizer information so as to output the corrected first equalizer information to the equalizer section, when the accepting section accepts the selection of the second equalizer information and the first headphone is used, correcting the second equalizer information stored in the first storage section by adding the second correction information stored in the second storage section to the second equalizer information so as to output the corrected second equalizer information to the equalizer section, when the accepting section accepts the selection of the second equalizer information and the second headphone is used, outputting the second equalizer information stored in the first storage section to the equalizer section, wherein the equalizer section executes the equalizing process based on the first equalizer information or the second equalizer information output from the correcting section.

* * * * *